US006759975B1

(12) United States Patent
Lee et al.

(10) Patent No.: US 6,759,975 B1
(45) Date of Patent: Jul. 6, 2004

(54) DIGITAL-TO-ANALOG CONVERTER WITH A SHIFTED OUTPUT AND AN INCREASED RANGE

(75) Inventors: Bumha Lee, Mountain View, CA (US); Brian D. Segerstedt, Redwood City, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/600,222

(22) Filed: Jun. 19, 2003

(51) Int. Cl.[7] .............................................. H03M 1/66
(52) U.S. Cl. ..................................................... 341/144
(58) Field of Search ................................ 341/144, 135, 341/136; 323/234

(56) References Cited

U.S. PATENT DOCUMENTS

| | | | |
|---|---|---|---|
| 5,034,699 A | * | 7/1991 | Powell ......................... 330/86 |
| 5,668,550 A | * | 9/1997 | Coleman, Jr. ............... 341/119 |
| 6,384,763 B1 | * | 5/2002 | Leung et al. ................ 341/154 |
| 6,608,516 B1 | * | 8/2003 | Lennous ...................... 327/344 |

* cited by examiner

Primary Examiner—Peguy JeanPierre
(74) Attorney, Agent, or Firm—Darby & Darby P.C.; Mathew M. Gaffney (57) ABSTRACT

A digital-to-analog converter (DAC) comprises a current DAC, first and second resistance circuits, and an operational transconductance amplifier (OTA). The first resistance circuit is coupled between a first node and an output of the OTA. The second resistance circuit is coupled between the first node and a power supply node. The current DAC is arranged to provide an analog current to a first node in response to a digital input signal. The OTA has a first input that receives a stable DC reference voltage signal, and a second input that is coupled to the first node. A charge pump provides the local supply voltage of the OTA to improve the system dynamic range. The output voltage corresponds to the sum of the voltages across the first and second resistance circuits. An increase in the current produced by the current DAC causes a decrease in the output voltage.

20 Claims, 4 Drawing Sheets

DIGITAL-TO-ANALOG CONVERTER WITH A SHIFTED OUTPUT AND AN INCREASED RANGE

FIELD OF THE INVENTION

The present invention relates to digital-to-analog converters, and, in particular, to a low power digital-to-analog converter with a shifted output and an increased range to improve the system dynamic range.

BACKGROUND OF THE INVENTION

A digital-to-analog converter (DAC) is configured to convert a digital signal into an analog voltage. One type of DAC comprises a tapped set of resistors, wherein one of the tap points is coupled to an op-amp at a summing junction. In this type of DAC, the output voltage is proportional to the voltage of the selected tap point. Several other kinds of DACs are known in the art, such as: R-2R ladders, current-switched DACs, and pulse width modulation DACs.

BRIEF DESCRIPTION OF THE DRAWINGS

Non-limiting and non-exhaustive embodiments of the present invention are described with reference to the following drawings.

DETAILED DESCRIPTION OF THE PREFERRED EMBODIMENT

Throughout the specification and claims, the following terms take the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other signal. Referring to the drawings, like numbers indicate like parts throughout the views.

Briefly stated, the invention is related to a DAC circuit. The DAC circuit comprises a current DAC, first and second resistance circuits, and an operational transconductance amplifier (OTA). The first resistance circuit is coupled between a first node and an output of the OTA. The second resistance circuit is coupled between the first node and a power supply node. The current DAC is arranged to provide an analog current to a first node in response to a digital input signal. The OTA has a first input that receives a stable DC reference voltage signal, and a second input that is coupled to the first node. A charge pump provides the local supply voltage of the OTA to improve the system dynamic. The output voltage corresponds to the sum of the voltages across the first and second resistance circuits. An increase in the current produced by the current DAC causes a decrease in the output voltage.

Figure 1:
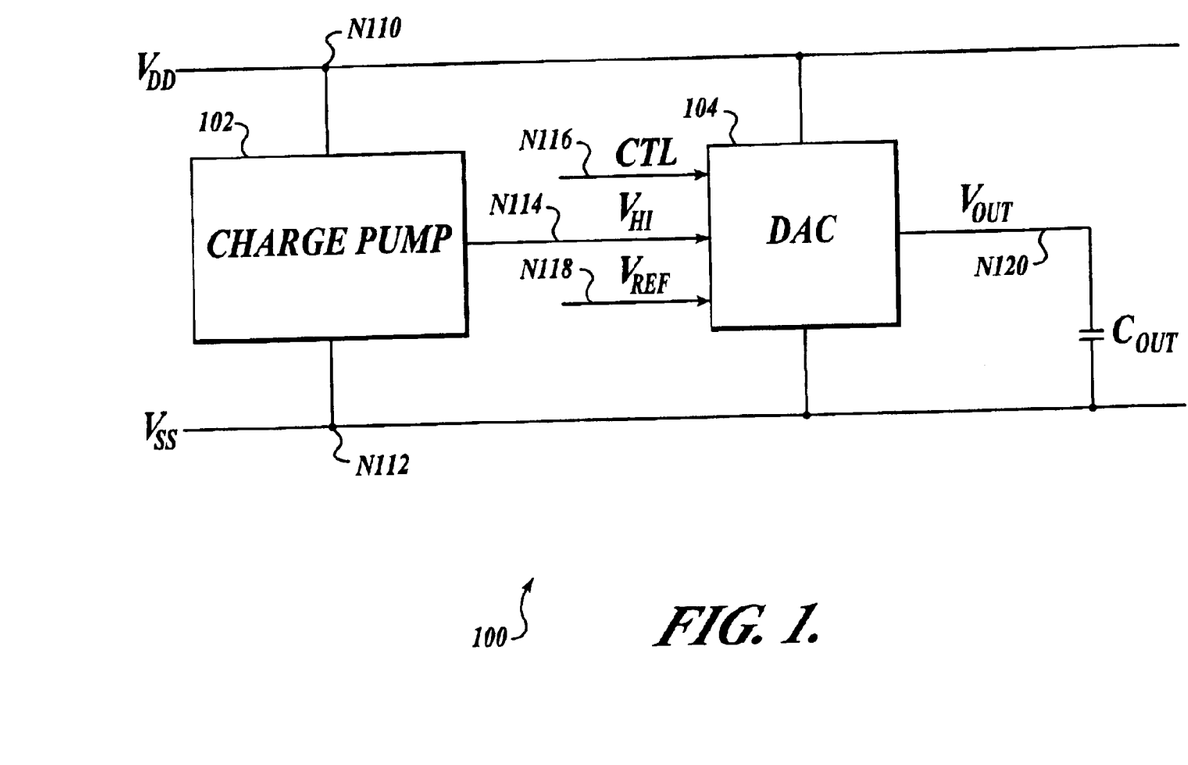
FIG. 1 is an illustration of an example embodiment of a circuit for digital-to-analog conversion that is arranged in accordance with aspects of the present invention.

FIG. 1 is an illustration of an example embodiment of a circuit (100) for digital-to-analog conversion that is arranged in accordance with aspects of the present invention. Circuit 100 includes a charge pump circuit (102), and DAC circuit (104), and a capacitive load (Cout). Charge pump circuit 102 is coupled to node N110 and node N112. DAC circuit 104 has a first input that is coupled to node N116, a second input that is coupled to node N118, a third input that is coupled to node N114, a fourth input that is coupled to node N110, a fifth input that is coupled to node N112, and an output that is coupled to node N120. Capacitive load Cout is coupled between nodes N120 and N112.

Circuit 100 is configured to operate as follows below. A first supply signal ($V_{SS}$) is applied at node N112 and a second supply signal ($V_{DD}$) is applied at node N110. Charge pump circuit 102 is configured to provide a signal ($V_{HI}$) at node N114 in response to signals $V_{DD}$ and $V_{SS}$. The voltage associated with signal VHI is higher, relative to signal $V_{SS}$, than the voltage associated with signal $V_{DD}$.

DAC circuit 104 is configured to provide an output voltage (Vout) at node N120 in response a digital input control signal (CTL) at node N116, a reference signal (Vref) at node N118, and signal $V_{HI}$. Capacitive load Cout is a purely capacitive load. Therefore, there is approximately no DC load current. DAC circuit 104 is configured such that the upper output voltage range is greater than the voltage associated with signal $V_{DD}$, relative to $V_{SS}$. According to one example, the voltage associated with $V_{SS}$ is 0V, the voltage associated with $V_{DD}$ is 3.3V, the voltage associated with Vref is 1V, and the output voltage range of DAC circuit 104 corresponds to 1V–3.5V. In another example, the voltage associated with signal Vref corresponds to a bandgap voltage of approximately 1.2V.

According to one example, circuit 100 may be arranged for a CMOS imager application. In this example, DAC circuit 104 is configured to pull the reset level of the pixels to a level that is higher than the supply level such that the pixels have an extended dynamic range. In this example, capacitive load Cout corresponds to approximately the sum of the gate capacitances that are associated with each reset transistor in a row of reset transistors and a metal parasitic capacitance. Alternatively, circuit 100 may be used for other applications.

Figure 2:
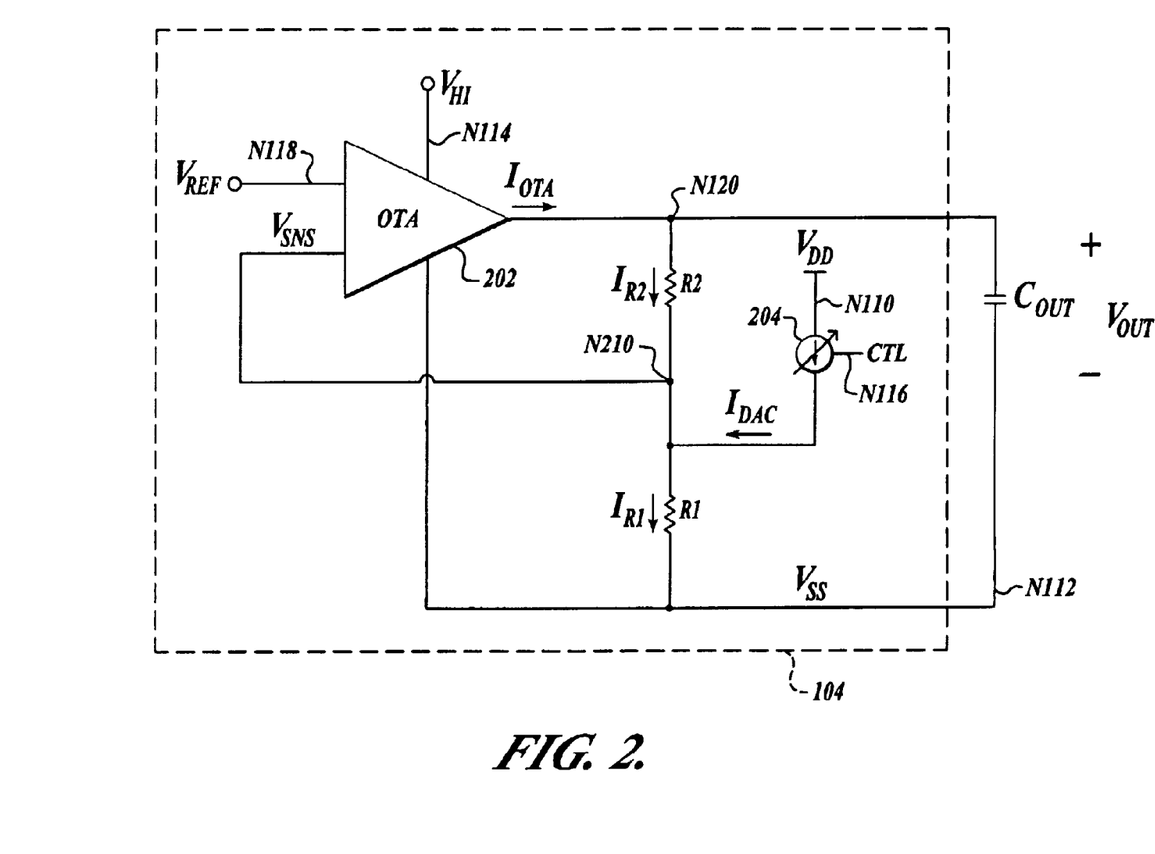
FIG. 2 is an illustration of an example embodiment of a digital-to-analog converter circuit that is arranged in accordance with aspects of the present invention.

FIG. 2 is an illustration of an example embodiment of the DAC circuit (104), arranged in accordance with aspects of the present invention. DAC circuit 104 includes an OTA circuit (202), resistance circuits (R1, R2) and a current DAC (204). OTA 102 has a first input that is coupled to node N118, a second input that is coupled to node N210, and an output that is coupled to node N120. Resistance circuit R1 is coupled between node N210 and node N112. Resistance circuit R2 is coupled between node N120 and node N210. Current DAC 204 is coupled between node N110 and node N210, and has a control port that is coupled to node N116.

DAC circuit 104 is configured to operate as follows below. OTA circuit 202 is configured to provide a current ($I_{OTA}$) to node N120 in response to a comparison between signal Vref and a signal at node N210 ($V_{SNS}$). Signal $V_{SNS}$ is response to the output voltage (Vout) at node N210. OTA circuit 202 is arranged to operate in a negative feedback loop such that the voltage associated with signal $V_{SNS}$ is approximately equal to the voltage associated with signal Vref. The voltage drop across resistance circuit R1 is approximately Vref, such that the current through resistance circuit R1 ($I_{R1}$) is approximately given by $I_{R1}$=Vref/R1. Signal $V_{HI}$ operates as a local power supply for OTA 202 such that the output voltage range for Vout is extended above $V_{DD}$.

Current DAC 204 is configured to provide a current ($I_{DAC}$) to node N210 in response to a digital input signal (CTL). Current $I_{R1}$ approximately corresponds to Iref/R1, such that the current through resistance circuit R2 ($I_{R2}$) is approximately given by $I_{R2}$=Vref/R1−$I_{DAC}$. Accordingly, the output voltage (Vout) is approximately given by Vout= [(Vref/R1)−$I_{DAC}$]*R2+Vref, or Vout=Vref*[1+(R2/R1)]−R2*$I_{DAC}$. Vout is at a maximum value when $I_{DAC}$ is zero. Vout decreases as $I_{DAC}$ increases while current flows through resistance circuit R2 and OTA 202 is in closed loop operation.

The current ($I_{DAC}$) that is provided by current DAC 104 is sourced from $V_{DD}$. The current ($I_{OTA}$) that is provided by OTA 202 is sourced from $V_{HI}$. DAC circuit 104 is arranged to minimize the current that is sourced from VHI such that power is conserved.

According to one specific embodiment of DAC circuit 104, R2/R1 is selected to equal 2.5, Vref is selected to equal 1V, and signal CTL corresponds to a six-bit digital control code. In this embodiment, Vout corresponds to approximately 3.5V when signal CTL corresponds to 000000, and Vout corresponds to approximately 1.0V when signal CTL corresponds to 111111, where $I_{DAC}$ is the same as $I_{R1}$.

Figure 3:
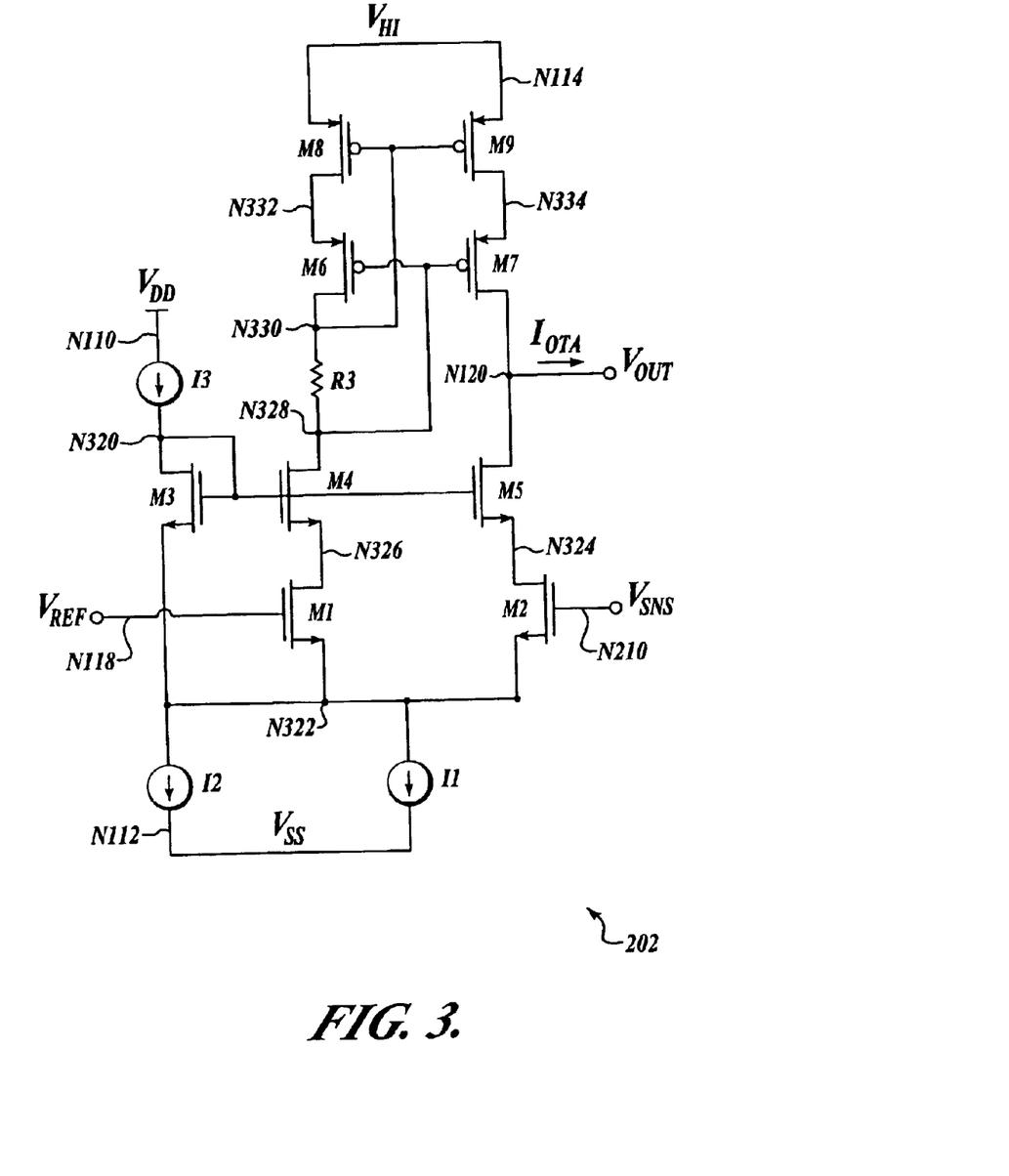
FIG. 3 is an illustration of an example embodiment of an operational transconductance amplifier circuit that is configured for operation in the digital-to-analog converter circuit.

FIG. 3 is an illustration of an example embodiment of an OTA circuit (202) that is configured for operation in DAC circuit 104. OTA circuit 202 includes transistors (M1–M9), current sources (I1–I3) and a resistance circuit (R3). Transistor M1 has a gate that is coupled to node N118, a source that is coupled to node N322, and a drain that is coupled to node N326. Transistor M2 has a gate that is coupled to node N210, a source that is coupled to node N322, and a drain that is coupled to node N324.

Transistor M3 has a gate that is coupled to node N320, a drain that is coupled to node N320, and a source that is coupled to node N322. Transistor M4 has a gate that is coupled to node N320, a drain that is coupled to node N328, and a source that is coupled to node N326. Transistor M5 has a gate that is coupled to node N320, a drain that is coupled to node N120, and a source that is coupled to node N324. Transistor M6 has a gate that is coupled to node N328, a drain that is coupled to node N330, and a source that is coupled to node N332. Transistor M7 has a gate that is coupled to node N328, a drain that is coupled to node N120, and a source that is coupled to node N334. Transistor M8 has a gate that is coupled to node N330, a drain that is coupled to node N332, and a source that is coupled to node N114. Transistor M9 has a gate that is coupled to node N330, a drain that is coupled to node N334, and a source that is coupled to node N114.

Current source I1 is coupled between node N322 and node N112. Current source I2 is coupled between node N322 and node N112. Current source I3 is coupled between node N110 and node N320. Resistance circuit R3 is coupled between node N330 and node N328.

OTA circuit 202 is configured to operate as follows. A first supply signal ($V_{SS}$) is applied at node N112, and a second supply signal ($V_{DD}$) is applied at node N110. Signal $V_{HI}$ is applied at node N114. Signal Vref is received at node N118, and signal $V_{SNS}$ is received at node N210.

Transistors M1 and M2 are configured to operate as a differential pair. Transistor M4 is configured to operate as a cascode transistor in cooperation with transistor M1. Transistor M5 is configured to operate as a cascode transistor in cooperation with transistor M2. Transistors M8 and M9 are arranged to operate as a current mirror load. Transistor M6 is configured to operate as a cascode transistor in cooperation with transistor M8. Transistor M7 is configured to operate as a cascode transistor in cooperation with transistor M9. Current source circuit I1 is configured to provide a tail current to OTA 204.

Resistance circuit R3 is arranged to bias cascode transistors M6 and M7. The current through resistance circuit R3 ($I_{R3}$) is approximately given by I1/2, such that the voltage between nodes N328 and N330 is approximately given by R3*(I1/2). The voltage at node N332 is approximately equal to $V_{HI}$−$V_{GS}$, where $V_{GS}$ is the gate-to-source voltage of transistor M8 (or M9). The voltage at node N328 is approximately given by $V_{HI}$−$V_{GS}$−R3*(I1/2). The resistance of resistance circuit R3 is selected to provide an appropriate bias voltage to cascode transistors M6 and M7.

Transistor M3, current source I2, and current source I3 are arranged in cooperation to bias cascode transistors M4 and M5. Transistors M1 and M3 have a common source at node N332. Transistor M3 is configured such that the $V_{GS}$ of transistor M3 is greater than the $V_{GS}$ of transistor M1. For example, transistor M3 may have a long channel length and a short channel width such that the $V_{GS}$ of transistor M3 is relatively large. Current source I2 and current source I3 are each configured to produce approximately the same current. Current source I3 is arranged to operate such that the current that is provided by current source I3 is sourced from $V_{DD}$.

Many alternative embodiments of OTA circuit 202 are possible. For example, current sources I1 and I2 may combined into one current source. Current source I3 may be replaced with an alternative kind of current-limiting device, such as a resistor. Resistance circuit R3 may be replaced with an alternative circuit that is configured to bias cascode transistors M6 and M7. Transistor M3 may be replaced with an alternative circuit that is configured to bias cascode transistors M4 and M5.

Figure 4:
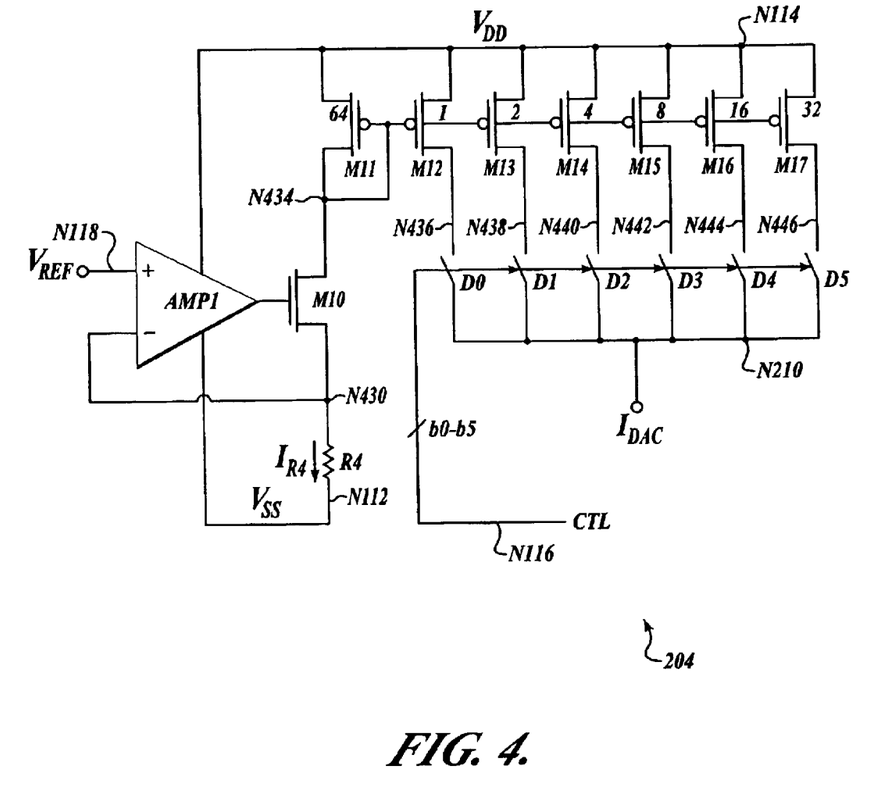
FIG. 4 is an illustration of an example embodiment of a current digital-to-analog converter circuit that is configured for operation in the digital-to-analog converter circuit.

FIG. 4 is an illustration of an example embodiment of a current digital-to-analog converter circuit (204) that is configured for operation in DAC circuit 104. Circuit 204 includes transistors (M10–M17), a resistance circuit (R4), and an amplifier circuit (AMP1). Amplifier circuit A1 has a noninverting input that is coupled to node N118, an inverting input that is coupled to node N430, a first power supply input that is coupled to node N114, a second power supply input that is coupled to node N112, and an output that is coupled to node N432. Resistance circuit R4 is coupled between node N430 and node N112. Transistor M10 has a gate that is coupled to node N432, a drain that is coupled to node N434, and a source that is coupled to node N430. Transistor M11 has a gate that is coupled to node N434, a drain that is coupled to node N434, and a source that is coupled to node N114.

Transistor M12 has a gate that is coupled to node N434, a drain that is coupled to node N436, and a source that is coupled to node N114. Transistor M13 has a gate that is coupled to node N434, a drain that is coupled to node N438, and a source that is coupled to node N114. Transistor M14 has a gate that is coupled to node N434, a drain that is coupled to node N440, and a source that is coupled to node N114. Transistor M15 has a gate that is coupled to node N434, a drain that is coupled to node N442, and a source that is coupled to node N114. Transistor M16 has a gate that is coupled to node N434, a drain that is coupled to node N444, and a source that is coupled to node N114. Transistor M17 has a gate that is coupled to node N434, a drain that is coupled to node N446, and a source that is coupled to node N114.

Circuit 204 is configured to operate as follows below. A first supply signal ($V_{SS}$) is applied at node N112, and a second supply signal ($V_{DD}$) is applied at node N114. A reference signal (Vref) is applied at node N118, and a control signal (CTL) is applied at node N116 (e.g. digital control signal b0–b5).

Amplifier circuit AMP1 is arranged to operate in a negative feedback loop such that the voltage at node N430 is approximately equal to Vref when steady state conditions are reached. The current through resistance circuit R4 ($I_{R4}$) is approximately given by $I_{R4}$=Vref/R4. Transistors M11–M17 comprise a current mirror that is arranged to reflect a weighted version of $I_{R4}$ to the drains of transistors M12–M17. For example, transistors M11–M17 may be binary weighted such that transistors M12–M17 provide drain currents of $I_{R4}/64$, $I_{R4}/32$, $I_{R4}/16$, $I_{R4}/8$, $I_{R4}/4$, and $I_{R4}/2$ respectively. The switches (D0–D5) are controlled by the control signal (CTL), which corresponds to a 6-bit digital code in one embodiment. Each bit of signal CTL (b0–b5) controls a respective switch (D0–D5). Each of the weighted currents that are provided by transistors M11–M17 is coupled to a corresponding switch (D0–D5). Each of the weighted currents that are coupled to an actuated switch is combined at node N210 to provide signal $I_{DAC}$ at node N210.

Resistance circuits R1–R4 may each comprise one or more resistors. Alternatively, resistance circuits R1–R4 may each comprise one or more devices that are configured to operate as a resistor (e.g. MOSFETs).

Since $I_{DAC}$ is proportional to Vref/R4, R4 is proportional to R1 and R2. Resistance circuits R1, R2, and R4 comprise matched resistor circuit types such as resistors, FETs biased as resistors, etc. Resistance circuits R1, R2, and R4 further comprise matched materials and matched layout sizes such that variation over process, temperature, and voltage are matched. The matching between R1 and R2 ensures that selected ratios between R1, R2, and R4 are accurate. Only the accuracy of the ratio between R1, R2, and R4 is significant, not the accuracy of the values of the individual resistance circuits.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A digital-to-analog converter circuit that is arranged to drive a capacitive load, the circuit comprising:
   a current digital-to-analog converter that is configured to provide a first current to a sense node in response to a digital input signal, wherein the current digital-to-analog converter is coupled to a first power supply node;
   a first resistance circuit that is coupled between the sense node and a second power supply node;
   a second resistance circuit that is coupled between the sense node and an output node; and
   an amplifier circuit having a first amplifier input, a second amplifier input, and an amplifier output, wherein the amplifier circuit is configured to receive a reference signal at the first amplifier input, the second input is coupled to the sense node, the amplifier output is coupled to the output node, the amplifier circuit is arranged such that the voltage associated with the sense node is approximately constant when steady state conditions are reached, the amplifier circuit is further coupled to a local power supply node, and wherein the local power supply node has a voltage that is higher than a voltage that is associated with the first supply node relative to the second power supply node.

2. The digital-to-analog converter circuit of claim 1, wherein the first resistance circuit comprises at least one of a first resistor and a transistor that is biased as a resistor, the second resistance circuit comprises at least one of a second resistor and a transistor that is biased as another resistor, wherein the first and second resistance circuits are matched types.

3. The digital-to-analog converter circuit of claim 1, wherein the voltage associated with the local power supply of the amplifier circuit is provided by a charge pump circuit in response to the voltages associated with the first power supply node and the second power supply node.

4. The digital-to-analog converter circuit of claim 1, wherein the amplifier circuit comprises:
   a differential pair; and
   a load circuit, wherein the load circuit is coupled to the local power supply node.

5. The digital-to-analog converter circuit of claim 1, wherein the amplifier circuit comprises:
   a differential pair;
   a current mirror load comprising first and second transistors;
   a third transistor that is configured to operate as a cascode transistor in cooperation with the first transistor; and
   a fourth transistor that is configured to operate as a cascode transistor in cooperation with the second transistor.

6. The digital-to-analog converter circuit of claim 5, the amplifier circuit further comprising a third resistance circuit, wherein the third resistance circuit is coupled between the gate of first transistor and the gate of the third transistor.

7. The digital-to-analog converter circuit of claim 1, the amplifier circuit further comprising:
   a differential pair comprising first and second transistors;
   a third transistor that is configured to operate as a cascode transistor in cooperation with the first transistor;
   a fourth transistor that is configured to operate as a cascode transistor in cooperation with the second transistor; and
   a load circuit, wherein the load circuit is coupled to the local power supply node.

8. The digital-to-analog converter circuit of claim 7, the amplifier circuit further comprising:
   a fifth transistor having a gate that is coupled to the gate of the third and fourth transistors, a source that is coupled to the source of the first and second transistors, and a drain that is coupled to the gate of the fifth transistor, wherein the fifth transistor is configured such that a gate to source voltage of the fifth transistor is significantly greater than a gate to source voltage of the first transistor; and
   a current-limiting device that is coupled between the first supply node and the drain of the fifth transistor.

9. The digital-to-analog converter circuit as in claim 8, wherein the current-limiting device comprises one of a fourth resistance circuit and a first current source circuit.

10. The digital-to-analog converter circuit of claim 1, wherein the amplifier circuit comprises:
a first transistor having a first gate, a first source, and a first drain, wherein the first gate corresponds to the first amplifier input;
a second transistor having a second gate, a second source, and a second drain, wherein the second source is coupled to the first source, and the second gate corresponds to the second amplifier input;
a third transistor having a third gate, a third source, and a third drain, wherein the third source is coupled to the first source, and the third drain is coupled to the third gate;
a fourth transistor having a fourth gate, a fourth source, and a fourth drain, wherein the fourth source is coupled to the first drain, and the fourth gate is couple to the third gate;
a fifth transistor having a fifth gate, a fifth source, and a fifth drain, wherein the fifth gate is coupled to the fourth gate, and the fifth source is coupled to the second drain;
a sixth transistor having a sixth gate, a sixth source, and a sixth drain, wherein the sixth gate is coupled to the fourth drain;
a third resistance circuit that is coupled between the fourth drain and the sixth drain;
a seventh transistor having a seventh gate, a seventh source, and a seventh drain, wherein the seventh drain is coupled to the fifth drain, and the seventh gate is coupled to the sixth gate;
a eighth transistor having a eighth gate, a eighth source, and a eighth drain, wherein the eighth drain is coupled to the sixth source, and the eighth source is coupled to the local power supply node;
a ninth transistor having a ninth gate, a ninth source, and a ninth drain, wherein the ninth source is coupled to the eighth source, and the ninth drain is coupled to the seventh source;
a fourth resistance circuit that is coupled between the third drain and the first power supply node; and
a first current source circuit that is coupled between the first source and the second power supply node.

11. A digital-to-analog converter circuit that is arranged to provide an output voltage to a capacitive load in response to a digital input signal, the circuit comprising:
a current digital-to-analog converter that is arranged to provide a first current to a sense node in response to the digital input signal, wherein the current digital-to-analog converter is coupled to a first power supply node such that the first current is sourced from a voltage that is associated with the first power supply node;
a first means for providing that is configured to provide a second current in response to a sense voltage and a reference voltage, wherein the sense voltage is associated with the sense node, the means for providing has a local power supply voltage that corresponds to a local power supply node, the local supply voltage is higher than the voltage that is associated with the first power supply node relative to a voltage associated with a second power supply node, at least part of the second current is sourced from the local power supply voltage, and wherein the first means for providing is configured to couple at least part of the second current to the sense node; and a first means for converting that is configured to convert a sum of the first and second currents to the sense voltage, wherein the output voltage is limited by the local supply voltage.

12. The digital-to-analog converter circuit of claim 11, further comprising a charge pump circuit, wherein the charge pump circuit is arranged to provide the local power supply voltage in response to the voltage associated with the first power supply node and the voltage associated with the second power supply node.

13. The digital-to-analog converter circuit of claim 11, wherein
the first means for converting is coupled between the sense node and the second power supply node; and
wherein the first means for providing comprises:
a second means for converting that is coupled between the sense node and an output node;
a means for amplification having a first amplifier input, a second amplifier input, and an amplifier output, wherein the means for amplification is configured to receive the reference signal at the first amplifier input, the means for amplification is further configured to receive the sense voltage at the second amplifier output, and the amplifier output is coupled to the output node, the amplifier circuit is arranged such that the sense voltage is approximately constant when steady state conditions are reached, and wherein the amplifier circuit is further coupled to the local power supply node.

14. The digital-to-analog converter circuit of claim 13, wherein the first means for converting comprises at least one of a first resistor and a transistor that is biased as a resistor, the second means for converting comprises at least one of a second resistor and a transistor that is biased as another resistor, wherein the first and second means for converting are matched types.

15. The digital-to-analog converter circuit of claim 11, wherein the means for amplification comprises:
a differential pair;
a second means for providing that is configured to provide a tail current; and
a load circuit, wherein the load circuit is coupled to the local power supply node.

16. A method for producing an analog voltage with a capacitive load in response to a digital input signal, the method comprising:
providing a first current in response to a digital input signal such that the first current is sourced from a voltage that is associated with a first power supply node;
coupling the first current to a sense node;
providing a second current in response to a sense voltage and a reference voltage such that at least part of the second current is sourced from a voltage associated with a local power supply node, wherein the voltage that is associated with the local power supply node is higher than the voltage that is associated with the first supply node relative to a second power supply node;
coupling at least a portion of the second current to the sense node; and
converting the sum of the first and second currents to the sense voltage, wherein the analog voltage is limited by the voltage associated with the local supply node.

17. The method of claim 16, further comprising providing the voltage associated with the local power supply node, wherein providing the voltage is accomplished via a charge pump circuit that is responsive to the voltage associated with the first power supply node and the voltage associated with the second power supply node.

18. The method of claim 16, wherein providing the first current comprises performing a current digital-to-analog conversion.

19. The method of claim 16, wherein converting the sum is accomplished via a resistance circuit that is coupled between the sense node and the second supply node, and wherein coupling the second current to the sense node comprises providing output node, wherein the analog voltage is associated with the output node, and the output node is coupled to the sense node via another resistance circuit that is coupled between the output node and the sense node.

20. The method of claim 16, wherein providing the second current comprises providing second current such that the second current is approximately proportional to the difference between the reference voltage and the sense voltage.

* * * * *

UNITED STATES PATENT AND TRADEMARK OFFICE
CERTIFICATE OF CORRECTION

PATENT NO. : 6,759,975 B1
DATED : July 6, 2004
INVENTOR(S) : Bumha Lee et al.

It is certified that error appears in the above-identified patent and that said Letters Patent is hereby corrected as shown below:

Title page,
Item [74], *Attorney, Agent, or Firm*, delete "Mathew" and insert -- Matthew --.

Column 4,
Line 13, delete "11" and insert -- I1 --.

Column 10,
Line 1, after "providing" insert -- the second current to an --.
Line 2, after "and" insert -- wherein --.
Line 6, after "providing" insert -- the --.

Signed and Sealed this

Fifth Day of July, 2005

JON W. DUDAS
*Director of the United States Patent and Trademark Office*